United States Patent [19]

Michaels

[11] 4,428,062

[45] Jan. 24, 1984

[54] SURFACE ACOUSTIC WAVE CONVOLVER HAVING A HORN CENTRAL RAY TRANSIT TIME COMPENSATING STUB

[75] Inventor: Paul A. Michaels, Livonia, Mich.

[73] Assignee: The Bendix Corporation, Southfield, Mich.

[21] Appl. No.: 291,753

[22] Filed: Aug. 11, 1981

[51] Int. Cl.[3] .......... G06G 7/195; H01L 41/08; H03H 9/30

[52] U.S. Cl. .......... 364/821; 310/313 C; 310/313 D; 333/150; 333/157; 333/195

[58] Field of Search .......... 364/821, 861; 310/313 R, 313 A, 313 B, 313 C, 313 D; 333/150, 152, 153, 154, 157, 195

[56] References Cited

U.S. PATENT DOCUMENTS

| | | | |
|---|---|---|---|
| 3,672,462 | 6/1972 | Auer, Jr. | 179/115.5 H |
| 3,750,182 | 7/1973 | Kernweis | 343/783 |
| 3,852,529 | 12/1974 | Scharft | 179/1 MG |
| 4,050,541 | 9/1977 | Henricksen | 181/159 |
| 4,157,741 | 6/1979 | Goldwater | 181/159 |
| 4,180,710 | 12/1979 | Spranger | 179/115.5 H |
| 4,181,904 | 1/1980 | Weller et al. | 364/821 X |
| 4,369,390 | 1/1983 | Malocha et al. | 310/313 B |

FOREIGN PATENT DOCUMENTS 2451624 5/1975 Fed. Rep. of Germany ...... 333/153

OTHER PUBLICATIONS

"Wideband $LiNbO_3$ Elastic Convolver with Parabolic Horns",–Becker et al., 1979 Ultrasonics Symp. Proc. (IEEE, N.Y,) pp. 729–731.

Zakarevicus: Convolution and Imaging in Acoustic–Surface Wave Thin Film Guides, Electronics Letters, vol. 9, No. 16, Aug. 9, 1973.

Potter et al.: Surface Acoustic Wave Slanted Device Technology, IEEE Transactions in Sources and Ultrasonics, vol. SU–26, No. 6, Nov. 1979, pp.411–418.

Davis et al.: Elastic Convolver Using Planar Prism Waveguide Couplers, 1980 Ultrasonics Symposium, (Proceedings), Nov. 5–7, 1980 Boston MA. pp. 74–76.

*Primary Examiner*—Felix D. Gruber

*Attorney, Agent, or Firm*—W. G. Christoforo; Bruce L. Lamb

[57] ABSTRACT

A surface acoustic wave convolver (10) with parabolic horns (16, 18), a typical horn (16) having a compensating stub (**16*a*) at the horn input end (16*b*) disposed centrally on the horn longitudinal axis (19) to maintain the phase coherence at the horn output end Z(16*c*) of a wave traversing said horn (16**).

7 Claims, 2 Drawing Figures

SURFACE ACOUSTIC WAVE CONVOLVER HAVING A HORN CENTRAL RAY TRANSIT TIME COMPENSATING STUB

BACKGROUND OF THE INVENTION

This invention relates to surface acoustic wave (SAW) signal processing elements having parabolically tapered horns to reduce the acoustic beamwidth of a surface acoustic wave and more particularly to such horns which include means to maintain a coherent wave front at the outlet of the horn.

Surface acoustic wave signal processing elements known as convolvers are becoming an important component in the design of modern communications systems. One type that directly utilizes the acoustic nonlinearities of a piezoelectric substrate, and is known as a SAW elastic convolver, shows great promise for use in high frequency, wide bandwidth difficult environment systems. An example of this type of convolver was reported by R. A. Becher and D. H. Hurlburt at pages 729–731 of the Proceeding of the 1979 Ultrasonics Symposium. This convolver, which will be more particularly described with respect to FIG. 1 in the Description of the Preferred Embodiment below, generally comprises a set of opposing parabolically tapered horns to reduce the acoustic beamwidth of waves incident thereon and which are coupled thereto from acoustic wave generating transducers, the output from the horns being coupled to a narrow interaction channel where the actual signal convolution is accomplished. The beam compression increases the acoustic power density in the interaction channel so as to increase the convolution efficiency. The circuit elements described above are generally in the form of microstrip on a piezoelectric substrait, typically lithium niobate.

An essential characteristic of the horn design is that the propagation time of all acoustic waves therethrough be identical within extremely close limits, otherwise phase incoherence of the wave exiting the horn structure will result. Phase incoherence produces distortion of the transmission bandwidth characteristic and an effective reduction in convolver efficiency, neither of which is desirable.

Generally, the acoustic wave coupled to the input of a horn structure has a straight or coherent wave front which is perpendicular to longitudinal axis of the horn structure. The wave front coherence is essentially maintained as the wave traverses the horn with structure without interruption. Thus, the central rays of the wave will move in a straight line from the horn input end to its output end. However, rays to either side of the central rays will intercept the sides of the parabolic horn and will be reflected therefrom to the horn output end. These reflected rays will travel a longer distance through the horn structure from input to output than the central rays which reach the horn output without reflection. Thus, the central rays will reach the horn output end before the reflected rays. This difference in transit times between the central rays and the other portions of the wave is one cause of phase dispersion which undesirably reduces bandwidth characteristic and convolver efficiency. The amount of phase dispersion depends on the percentage of wave energy in the central rays, which in turn is dependent on the horn beam compression. In the typical convolver horn the input end is ten times wider than the output end, hence the central ray will contain 10% of the total wave energy. The phase shift of the wave intercepted ray with respect to the central ray at the horn output end is dependent on the horn transit time of the wall intercept ray with respect to the horn transit time of the central ray. For a parabolic horn the phase difference is also equivalent to twice the ray transit time between the focus and vertex of the horn. For practical devices operating at normal frequencies this will typically be about 90°.

SUMMARY OF THE INVENTION

In order to eliminate the difference in horn transit times of the various portions of a wave traversing the above mentioned horn structure, and to thus maintain a coherent front at the horn outlet, a central compensating stub, that provides a longer section of the horn structure for the central rays to traverse, is added to the horn structure, preferably at the horn input end. The added stub provides the advantage of making the total transit time of the wave central rays through the horn structure equal to the transit time of the wall intercepted rays. This in turn provides the advantage of maintaining the coherence of the wave front at the horn outlet.

DESCRIPTION OF THE PREFERRED EMBODIMENT

Figure 1:
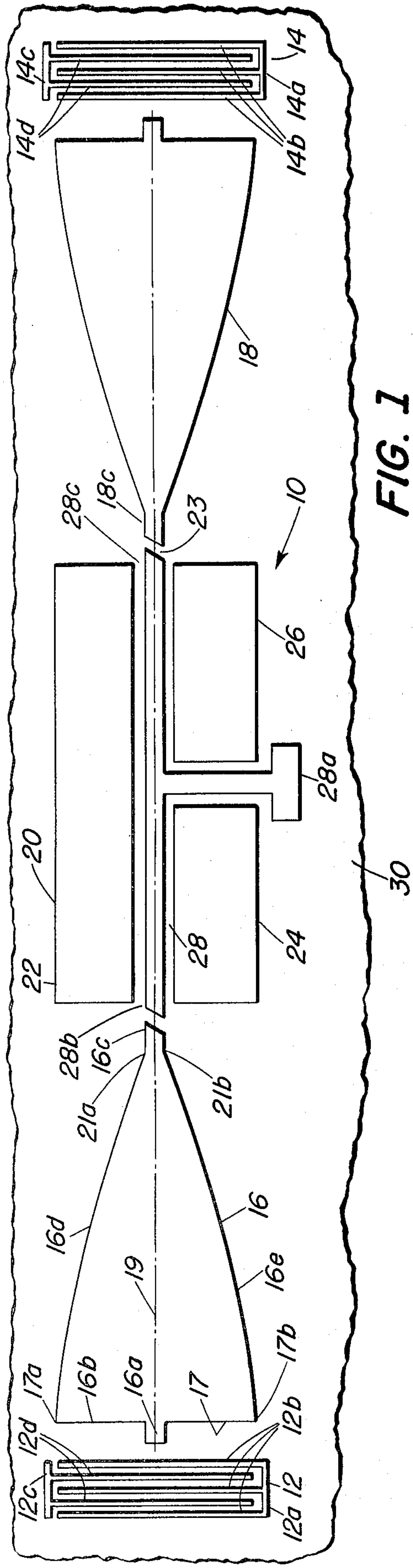
FIG. 1 illustrates a typical surface acoustic wave (SAW) convolver which includes the invention.

The invention is illustrated in the SAW convolver 10 of FIG. 1, reference to which should be made. The convolver is comprised of input transducers 12 and 14, parabolic horns 16 and 18 and interaction channel structure 20 which in turn is comprised of the ground planes 22, 24 and 26 and interaction channel 28. These elements, as known to those in the art, are microstrip disposed on a flat surface 30 of a piezoelectric material, typically lithium niobate. A typical horn, for example horn 16, includes an input end *16b*, an output end *16c*, and side walls *16d* and *16e* which define a parabola, as will be shown more particularly with reference to FIG. 2. Typical horn input end *16b* is generally defined by a straight line 17 perpendicular to the horn longitudinal axis 19, which axis is coextensive with the longitudinal axis of horn 18 and interaction channel 28, except for typical compensating stub *16a* located at and an integral part of horn input end *16b* centered on longitudinal axis 19. The function and size of compensating stub *16a* will be more particularly explained with respect to FIG. 2.

The function of convolver 10 is to convolve one signal, applied at transducer 12, with a second signal, applied at transducer 14, to produce the convolved resultant at port *28a*, which is a branch extending at a right angle from the midpoint of interaction channel 28.

The operation of convolver 10 is as follows. One signal, suitably an electrical signal, is applied (by means not shown) to transducer 12 across interleafed sections *12a* and *12c*, respectively comprised of conductive tracks *12b* interleafed with conductive tracks *12d*. In response to the applied electrical signal transducer 12 generates an acoustic wave on the piezoelectric surface whose wave front is parallel to tracks 12*b* and 12*d*. The wave is received at input end 16*b*, including compensating stub 16*a*, of parabolic horn 16. The wave incident on horn input end 16*b* tends to be contained within the horn structure and the wave front traverses therethrough generally perpendicular to longitudinal axis 19 toward horn output end 16*c*. In this description the portions of the wave incident on stub 16*a* are termed the central rays and the stub is so proportioned, as will be explained below, that the central rays will traverse the length of horn 16 without being intercepted by the parabolic sides 16*d* and 16*e* of the horn. The portion of the wave incident on input end 16*b* but outside the central rays will be intercepted by parabolic sides 16*d* and 16*e* and reflected therefrom into output end 16*c*. This action of the horn will compress the wave or beam traversing therethrough by a factor equal to the ratio of the width of input end 16*b*, that is, the distance between points 17*a* and 17*b*, to the width of output end 16*c*, that is, the distance between points 21*a* and 21*b*. In a typical horn the beam compression will be about 10:1.

Simultaneously, a second signal, to be convolved with the first signal, is applied to transducer 14 across interleafed sections 14*a* and 14*c* comprised respectively of conductive tracks 14*b* interleafed with conductive tracks 14*d*. The resulting acoustic wave traverses horn 18 in the manner just described with respect to horn 16, and the beam compressed wave exits horn 18 at output end 18*c*. The beam compressed wave at horn output end 16*c* is coupled across the piezoelectric surface to port 28*b* of interaction channel 18 and the beam compressed wave at horn output end 18*c* is coupled across the piezoelectric surface to port 28*c* of interaction channel. The bias cut gap shown between a horn output end and an interaction channel, for example bias cut gap 23, provides less dispersion of the signal coupled between the horn output end and the interaction channel as known to those in the art. The acoustic waves in interaction channel 28 will interact or convolve with one another to produce the convolved resultant at port 28*a*.

Figure 2:
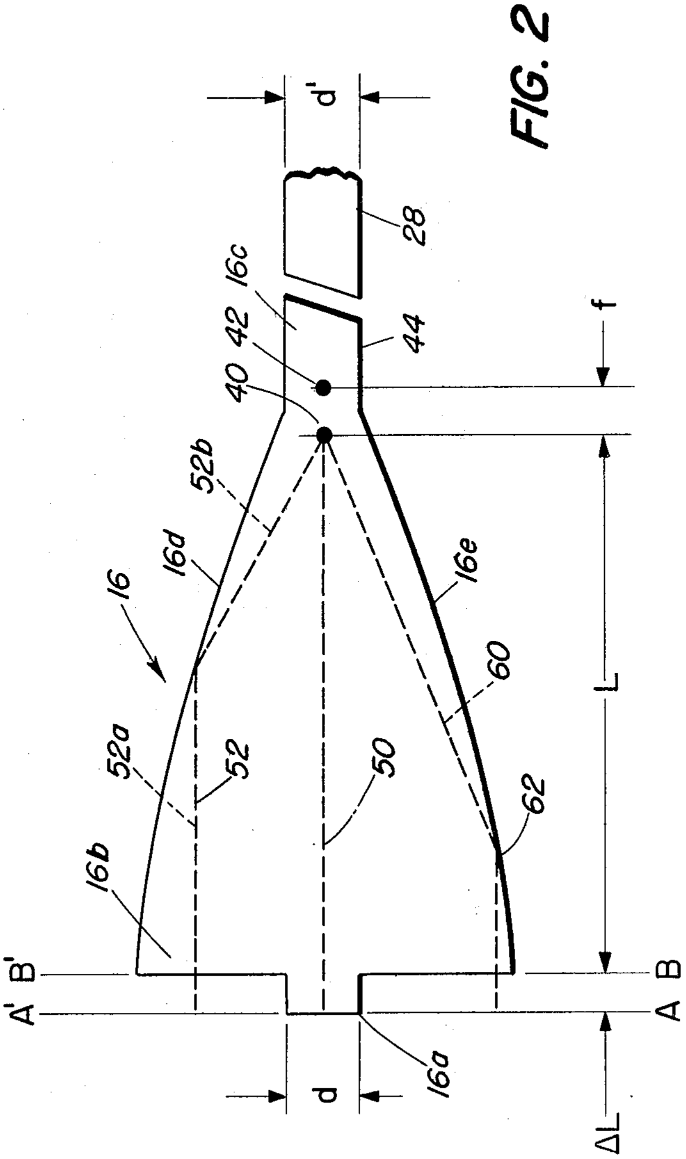
FIG. 2 shows a horn of FIG. 1 in greater detail with representative rays traversing therethrough and is helpful in describing how one can design the proper compensating stub for a particular set of parameters.

Refer now to FIG. 2 which shows typical horn 16 of FIG. 1 in greater detail. The horn includes, as described above, an input end 16*b*, output end 16*c* and sides 16*d* and 16*e* which describe a parabola having a focus 40 and a vertex 42. Input end 16*b* is generally defined by a line BB' except for compensating stub 16*a* where the input end is defined by line AA' which is parallel to line BB'. Output end 16*c* is defined by a second stub 44 which ideally exactly underlies stub 16*a*. That is, dimension d of stub 16*a* is equal to and in register with dimension d' of stub 44 (and interaction channel 28, here shown cutaway). The normal distance between lines AA' and BB', that is, the height of stub 16*a*, is designated αL. The normal distance between line BB' and focus 40 is designated L. The distance between focus 40 and vertex 42 is designated f.

Compensating stub 16*a* provides means for maintaining a wave which is coherent at line AA' generally coherent at the horn output end 16*c*. In other words, by use of compensating stub the transit time from line AA' to the horn output is made about equal for all parts of the wave. Broadly speaking, this is achieved by providing a longer section of the slower velocity medium, the material of the stub, for the central rays to traverse.

The transit time analysis for an ideal, isotropic substrate, which is here assumed, is shown immediately below. The equation of the parabolic horn form is:

$$y^2=4fx \quad (1)$$

where the origin is taken at vertex 42, the x-axis coincides with the horn longitudinal axis and the y-axis is normal thereto. The transit time through the horn of a typical central ray 50 as it traverses between line AA' and focus 40 is:

$$t_c=(L+\Delta L)/V_1 \quad (2)$$

where $V_1$ is the velocity of wave propagation in the horn material.

For any ray, for example ray 52, outside the central ray, that is, a ray reflected from a parabolic side 16*d* or 16*e* into focus 40, the transit time between line AA' and focus 40 is:

$$t_l=t_1+t_2 \quad (3)$$

where $t_1$ is the transit time of the ray in the horn material and $t_2$ is the transit time of the same ray between lines AA' and BB' where the velocity of propagation is $V_2$. Equation (3) thus becomes:

$$t_l=(D_1/V_1)+(\Delta L/V_2) \quad (4)$$

where $D_1$ is the path distance for any ray outside the central ray between line BB' and focus 40. By simple geometry of the parabola:

$$D_1=[L^2+4f(L+f)]^{\frac{1}{2}} \quad (5)$$

By combining equations (4) and (5) and equating the transit times for rays 50 and 52 the stub length, ΔL, is obtained:

$$\Delta L = \frac{V_2}{V_2 - V_1}\left[(L^2 + 4f(L + f))^{\frac{1}{2}} - L\right] \quad (6)$$

Simplifying equation (6) becomes:

$$\Delta L = \frac{2f\,V_2}{V_2 - V_1} \quad (7)$$

Although the above calculations are appropriate for an isotropic substrate such as lithium niobate, the use of the compensating stub for phase adjustment of the central rays for horn contours based on anisotropic substrates is equally appropriate. Although the principle involved is the same, the calculation of the horn transit time for rays outside the central rays is slightly more complicated than the calculations above for the isotropic substrate in that the phase velocity $V_1$ of equation (4) will depend upon the direction of a reflected ray. For example, with respect to FIG. 2, the velocity of that part 52*a* of ray 52 which is parallel to ray 50 will be the same as the velocity of ray 50. However, the velocity of the reflected ray 52*b* will differ because of the anisotropic nature of the substrate. A practical compensating stub height can be obtained for anistropic substrates by introducing a new phase velocity $V_3$ which is substituted for $V_1$ of equation (4), where $V_3$ is the velocity in the horn of a ray outside the central rays and which intercepts the horn side near line BB' of FIG. 2. For example, with respect to FIG. 2, $V_3$ is the phase velocity of ray 60, which is a ray taken from a point 62 on side 16e close to line BB′ and directed to focus 40. Substituting $V_3$ for $V_1$ in equation (4) and solving equations (5) and (6) as before for $\Delta L$:

$$\Delta L = \frac{V_2}{V_3(V_2 - V_1)}\left[V_1(L^2 + 4f(L + f))^{\frac{1}{2}} - V_3L\right] \tag{8}$$

It can be seen that if $V_3 = V_1$, as for the isotropic case, equation (8) above reduces to equation (6).

In a typical convolver the horns are 200 angstrom thick chromium. The other metallic parts are 200 angstrom thick chromium on 2000 angstrom thick aluminum. For the typical convolver operating at a 300 MHz center frequency and a 95 MHz bandwidth, the inlet end was 63 wavelengths ($\lambda$) wide and the outlet was $6.3\lambda$. A typical horn was 6.5 microsecond ($\mu$s) long and the interaction region was 10 $\mu$s long.

Having described this embodiment of my invention, various alterations and modifications thereof should now be obvious to one skilled in the art. Accordingly, my invention is to be limited only by the true spirit and scope of the appended claims.

The invention claimed is:

1. A surface acoustic wave convolver including at least one thin film parabolic horn disposed on a substrate and having a relatively wide input end for receiving a surface acoustic wave incident thereon and a relatively narrow output end toward which said wave propagates through said horn material, the central rays of said wave traversing said horn material directly to said output end and the rays of said wave outside said central rays traversing said horn material to said output end by reflection from the sides of said horn, an improvement comprised of a compensating stub disposed on said input end for intercepting said central rays to equalize the transit times of all parts of said wave from a line outside said horn and normal to the direction of travel of said wave to said output end.

2. The improvement of claim 1 wherein said compensating stub comprises an extension on said input end.

3. The improvement of claim 1 wherein said horn has a longitudinal axis which coincides with the x-axis of the parabolic horn, said compensating stub being disposed centrally on said longitudinal axis.

4. The improvement of claim 3 wherein the dimension of said compensating stub in the direction of travel of said wave is approximately equal to:

$$2f\,V_2/(V_2 - V_1)$$

where f is the distance from the focus to the vertex of the horn parabola, $V_2$ is the velocity of the surface acoustic wave in said substrate and $V_1$ is the velocity of said surface acoustic wave in said horn.

5. The improvement of claim 4 wherein said substrate is an isotropic crystal.

6. The improvement of claim 3 wherein said input end comprises an essentially straight line drawn across the mouth of said horn and said compensating stub on said straight line, the dimension of said compensating stub in the direction of travel of said wave being approximately equal to:

$$\frac{V_2}{V_3(V_2 - V_1)}\left[V_1(L^2 + 4f(L + f))^{\frac{1}{2}} - V_3L\right]$$

where f is the distance from the focus to the vertex of the horn parabola, $V_1$ is the velocity of said surface acoustic wave in said horn in a direction parallel to said longitudinal axis, $V_2$ is the velocity of said surface acoustic wave in said substrate in a direction parallel to said longitudinal axis, $V_3$ is the velocity of said surface acoustic wave in said horn in a direction from a side of said horn close to said input end toward said focus, and L is the distance from said line to said focus.

7. The improvement of claim 6 wherein said substrate is an anistropic crystal.

* * * * *